US006815620B2

(12) United States Patent
Dodsworth et al.

(10) Patent No.: US 6,815,620 B2
(45) Date of Patent: Nov. 9, 2004

(54) FLEXIBLE CIRCUIT WITH ELECTROSTATIC DAMAGE LIMITING FEATURE

(75) Inventors: Robert S. Dodsworth, Austin, TX (US); John B. Scheibner, Austin, TX (US); Ke Zhang, Singapore (SG); Chee Tat Ee, Singapore (SG); Juang Meng Mok, Singapore (SG); Yong Peng Lee, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/255,507

(22) Filed: Sep. 26, 2002

(65) Prior Publication Data

US 2003/0062194 A1 Apr. 3, 2003

Related U.S. Application Data

(63) Continuation-in-part of application No. 09/823,220, filed on Mar. 29, 2001, now Pat. No. 6,459,043.

(51) Int. Cl.⁷ ................................................. H05K 1/00
(52) U.S. Cl. ........................ 174/258; 174/254; 174/256; 174/261; 361/220; 361/751
(58) Field of Search ................................ 174/254, 261, 174/256, 258, 257, 5 R, 5 SB, 5 SG, 51, 72 A, 73.1, 119 C; 361/749, 750, 751; 428/355 AC, 344, 345

(56) References Cited

U.S. PATENT DOCUMENTS

| | | |
|---|---|---|
| 3,562,037 A | 2/1971 | Travis |
| 4,231,154 A | 11/1980 | Gazdik et al. |
| 4,383,728 A | 5/1983 | Litington |
| 4,400,410 A | 8/1983 | Green et al. |
| 4,480,288 A | 10/1984 | Gazdik et al. |
| 4,504,410 A | 3/1985 | Hempel et al. |
| 4,576,964 A | 3/1986 | Eggler et al. |
| 4,698,256 A | 10/1987 | Giglia et al. |
| 4,746,538 A | 5/1988 | Mackowski |
| 4,809,876 A | 3/1989 | Tomaswick et al. |
| 4,914,551 A | 4/1990 | Anschel et al. |
| 5,227,008 A | 7/1993 | Klun et al. |
| 5,350,594 A * | 9/1994 | Unruh .......................... 427/96 |
| 5,401,913 A | 3/1995 | Gerber et al. |
| 5,465,186 A | 11/1995 | Bajorek et al. |
| 5,478,616 A | 12/1995 | Kochem et al. |
| 5,508,071 A | 4/1996 | Banholzer et al. |
| 5,508,092 A | 4/1996 | Kimock et al. |
| 5,527,434 A * | 6/1996 | Hamnett et al. ............. 205/331 |
| 5,559,367 A | 9/1996 | Cohen et al. |

(List continued on next page.)

FOREIGN PATENT DOCUMENTS

| | | |
|---|---|---|
| EP | 0 615 257 A2 | 9/1994 |
| EP | 0 717 418 A2 | 6/1996 |
| EP | 1 178 712 A2 | 2/2002 |

OTHER PUBLICATIONS

"Electrostatic Discharge Screen Print Ink", International Business Machines Corp., IBM Technical Disclosure Bulletin, vol. 34, No. 6, Nov. 1991, p. 92.
International Search Report for PCT/US03/27362.

*Primary Examiner*—David A. Zarneke
*Assistant Examiner*—J B Patel
(74) *Attorney, Agent, or Firm*—Melanie G. Gover

(57) ABSTRACT

A flexible circuit incorporating an electrostatic discharge limiting feature, comprising a dielectric substrate selected from polyimide or liquid crystal polymer film having at least one conductive trace coated on at least one surface of the substrate wherein the discharge limiting feature includes a thin conductive polymer coating selectively applied over a at least a portion of the non-critical region of the circuit, said feature reducing the surface resistivity of the circuit to about $10^4$ ohms to about $10^8$ ohms and having tribocharging of less than about 50 V.

10 Claims, 4 Drawing Sheets

U.S. PATENT DOCUMENTS

| | | | |
|---|---|---|---|
| 5,643,343 A | | 7/1997 | Selifanov et al. |
| 5,699,212 A | * | 12/1997 | Erpelding et al. ....... 360/245.8 |
| 5,707,409 A | | 1/1998 | Martin et al. |
| 5,710,682 A | | 1/1998 | Arya et al. |
| 5,761,009 A | | 6/1998 | Hughbanks et al. |
| 5,770,216 A | * | 6/1998 | Mitchnick et al. .......... 425/402 |
| 5,792,558 A | | 8/1998 | Jonas et al. |
| 6,046,886 A | | 4/2000 | Himes et al. |
| 6,049,041 A | * | 4/2000 | Yoshioka et al. ...... 174/117 FF |
| 6,099,757 A | | 8/2000 | Kulkarni |
| 6,125,015 A | * | 9/2000 | Carlson et al. .......... 360/245.9 |
| 6,146,813 A | | 11/2000 | Girard et al. |
| 6,248,818 B1 | * | 6/2001 | Kim et al. .................. 524/157 |
| 6,316,734 B1 | | 11/2001 | Yang |
| 2002/0139569 A1 | | 10/2002 | Dodsworth |

\* cited by examiner

FLEXIBLE CIRCUIT WITH ELECTROSTATIC DAMAGE LIMITING FEATURE

CROSS-REFERENCE TO RELATED APPLICATION

This application is a continuation-in-part of U.S. Ser. No. 09/823,220, filed on March 29, 2001, now U.S. Pat. No. 6,459,043.

BACKGROUND OF THE INVENTION

Microflex circuits are widely used for applications such as integrated circuit (IC) packages, inkjet cartridges, hard disk drives (HDD), medical devices and other advanced flex circuit-based electrical connections. Such connections require electrical static discharge (ESD) protection during product manufacturing and assembly comprising insulating materials (plastic, polymers) and manual operations. ESD concerns are amplified in hard disk drive manufacturing environments and applications, especially for head gimbal assemblies (HGA) using giant magnetorestrictive read (GMR) sensors in the sliders. For current commercial hard disk drive (HDD) product platforms at 40 or 60 gigabit/in$^2$ [(GB)/in$^2$], electrostatic discharge protection is required to protect these sensitive read heads. ESD requirements are specified in terms of surface resistivity and tribocharge voltage control on all incoming components and nearby process/assembly workstations. The specifications from many HDD manufacturers indicated surface resistivities should preferably be controlled within a range of from about $10^4$ ohms to about $10^8$ ohms, and maximum surface voltage from tribocharging must be less than 10 Volts (V).

Based on latest HGA technology roadmaps, future HDD programs will be 80 to 100 GB/platter or higher, and will have stricter ESD requirements (tribocharge less than 5 V) for incoming components including flexible circuits for use in flex on suspension (FOS). Microactuator programs, complex slider structures and additional electrical connections and attachment on suspensions will require a good control of ESD as well. Damage caused by ESD accounts for a large portion of the HGA yield losses in the HDD industry, which has a significant impact on industry profits. Therefore, the ability to control ESD is very important to the HDD industry.

In U.S. Ser. No. 09/823,220, the application of a thin, narrow stripe of conductive composition was applied across at least two of the conductive elements of a flexible circuit to reduce the accumulation of static charge and balance the electrical potential across all of the conductive leads. This application also discloses that placing the conductive polymer layer beneath the protective covercoat layer allows the resulting FOS circuit to pass the HDD industry's strict ionic contamination testing.

However, it has now been discovered that a flexible circuit having a thin conductive polymer coating applied over a portion of a flexible circuit in the non-critical region reduces the measured surface voltage substantially.

SUMMARY OF THE INVENTION

The present invention is a flexible circuit incorporating electrostatic discharge (ESD) limiting features and designed for use in the fabrication of hard disk drives for computer applications.

In accordance with one embodiment of the present invention, a thin conductive polymer coating is applied over a portion of a flexible circuit in the non-critical region to reduce the measured surface voltage by enabling the flow of tribocharging induced charges on the coated surface allowing faster discharge from the affected area when contacted by a conducting, grounded probe. The conductive layer limits the rate of discharge due to its inherent resistivity. If the coating is in contact with a conductive polymer stripe, the built-up charges can also be discharged through probes contacting the coated, non-critical surface. The resulting circuits have added ESD protection because the conductive surface will enable discharge of any charges developed on its surface by starting the discharge as soon as they are created, thus lowering the peak voltage on the surface by enabling and controlling voltage level decay. Since the available energy to damage the GMR head is proportional to the voltage level when the energy is coupled through the sensitive GMR sensor, the total energy is reduced.

The thin conductive film will significantly reduce surface resistivity of the insulating materials from about $10^{11}$ ohms to about $10^{14}$ ohms to a range of about $10^4$ ohms to about $10^8$ ohms.

As used herein, these terms have the following meanings:
1. The term "non-critical region" means the region of the circuit between the actuator flex bond region and the gimbal region of the circuit. This is the area normally used for part handing during the assembly process.
2. The terms "interlever material" and "interlever layer" mean a layer of a material such as a release liner placed under the circuit to transfer the flex circuit web into the printing machine through splicing.

DETAILED DESCRIPTION OF THE INVENTION

Figure 1:
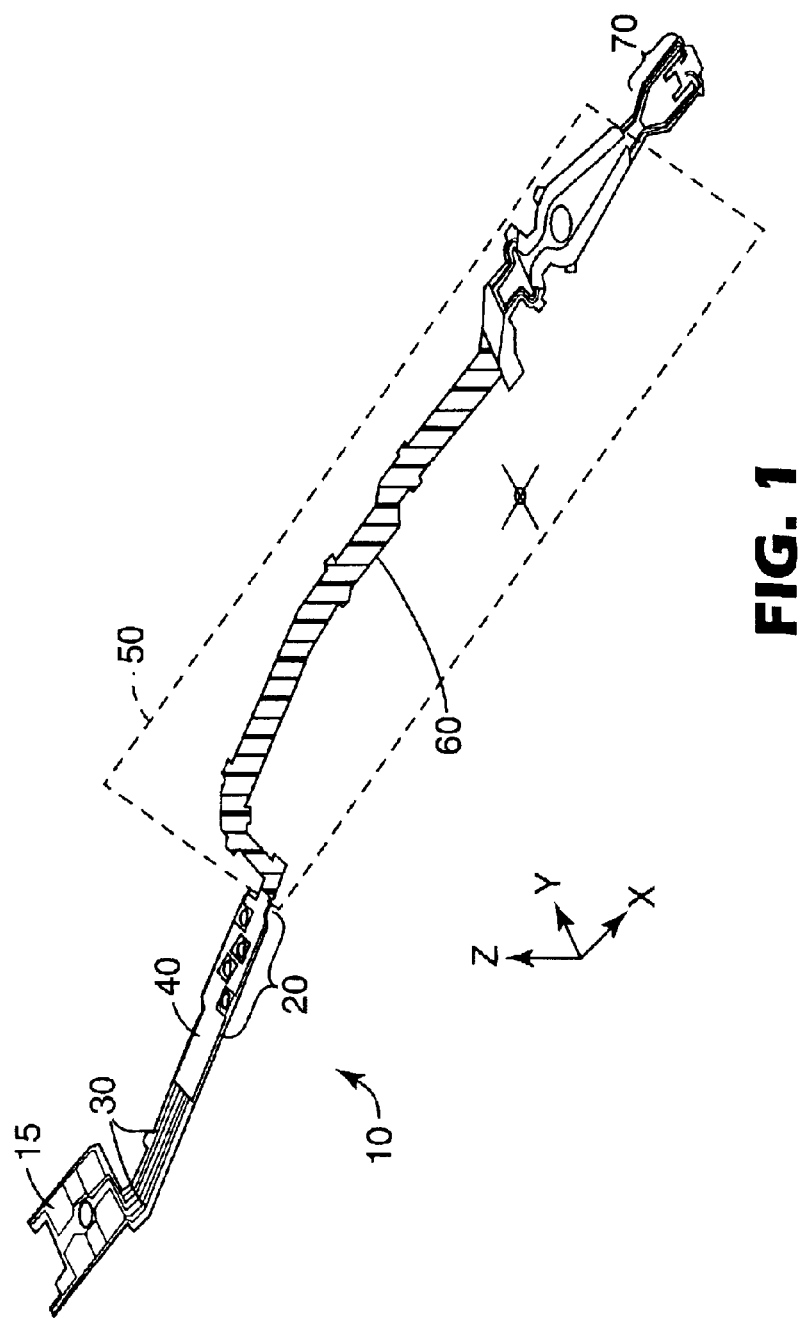
FIG. 1 is a plan view of a flexible circuit for use in a hard disk drive and featuring a conductive polymer film layer disposed in the non-critical area of the circuit in accordance with the present invention.

The present invention is a flexible circuit 10 incorporating electrostatic discharge (ESD) limiting features, as shown in FIG. 1, and designed for use in the fabrication of hard disk drives. Typically, HGAs are manually assembled. A static charge may build up on the surface of the flexible circuit during such handling as a result of contacting the insulative, protective covercoat with ungrounded probes, tools, or fixtures or by contacting another dielectric material such as rubber gloves. In accordance with an embodiment of the present invention, a thin conductive polymer coating 60 is applied over a portion of a flexible circuit 10 in the non-critical region 50. The non-critical region is the region of the circuit between the actuator flex bond region 20 and the gimble region of the circuit 70. This is the area normally used for part handing during the assembly process. The conductive polymer coating is applied on top of the selectively deposited protective covercoat layer 40. The conductive film layer formed from the conductive polymer coating will significantly reduce the surface resistivity of the materials from a range of about $10^{11}$ ohms to about $10^{14}$ ohms to a range of about $10^4$ ohms to about $10^8$ ohms. In this embodiment it is not necessary for the conductive polymer coating to contact the conductive leads in order to protect the circuit from ESD.

The conductive polymer compositions can be coated in a continuous reel-to-reel printing process to form a thin conductive polymer film element having a final cured thickness in the range of about 0.2 microns to about 25 microns, more preferably from about 0.5 micron to about 5 microns on a variety of insulating materials including polymer films, plastic surfaces, ceramics, glasses, fibers, and especially on flexible circuits. The flexible circuits may have either a polyimide or liquid crystal polymer dielectric substrate having at least one conductive trace on at least one surface of the dielectric substrate. The conductive traces have been formed by applying a photoresist to at least one surface of the dielectric substrate, patterning the resist with the desired circuit pattern, and additively plating said circuit pattern with a metal such as copper, nickel, gold or the like. Alternatively, a subtractive circuitization method may be employed to create the flexible circuit. Features such as through vias, blind vias, windows, depressions or thinner areas of the dielectric substrate and the like can be made in the dielectric film by such methods as chemical milling, laser ablation, mechanical punching and the like. After the circuit has been completed, a protective polymer covercoat may be either be applied selectively or to totally cover the circuit. The conductive polymer composition is then coated on the surface of this protective covercoat layer. The conductive polymer may be substantially transparent to visible light.

This invention relates specifically to flexible circuits for HGA components having surface resistivity in the range of about $10^4$ to $10^8$ ohms and tribocharging less than 50 V, More preferably less than 15 V depending on the surface resistivity of the conductive polymer film coating.

EXAMPLES

The preferred conductive polymer composition comprises a mixture of a conductive polymer, a nonionic binder material, a wetting agent, and a film former.

One preferred conductive polymer is an aqueous dispersion of poly-3-4-ethylenedioxythiophene complexed with polystyrene sulfonate available from Bayer Corporation of Pittsburgh, Pa. known as Baytron™ P-LS having low residual ionic content. The conductive polymer suspension is supplied having about 1% to about 4% solids by weight.

A preferred nonionic binder material is Rhoplex HA-16, which is a self-crosslinking acrylic binder available from Rohm and Haas Company of Philadelphia, Pa.

The preferred wetting agent is Zonyl®FSN available from Dupont Chemical Company, Wilmington, Del. The chemical structures will be "$R_fCH_2CH_2O\ (CH_2CH_2O)_xH$", where $R_f=F(CF_2CF_2)_y$, where X=0 to about 25, and Y=1 to about 9. The wetting agent is used to modify surface energy at very low concentrations, and is compatible with most aqueous or solvent-based solutions. The wetting agents are typically added at concentrations in the range of about 0.1% to about 0.5% by weight.

The preferred additive is 1-methyl-2-pyrolidone (NMP). The function of the NMP is to release more "free ionic" from the main frame of the conductive polymer chain to enhance conductivity. The magnitude of conductivity improvement will depend on the quantity of NMP added. The NMP is added in the range of about 2% to about 8% by weight and more preferably about 2% to about 4% by weight.

The conductive polymer composition is made by combining the aforementioned ingredients. In particular, 10% to 90% conductive polymer dispersion (Baytron P-LS) is supplied with the selected wetting agent already incorporated in the dispersion. This dispersion is combined with a mixture of 90% to 10% acrylic emulsion (RHOPLEX HA-16) and 2% to 8% NMP. The pH of the resulting mixture is then adjusted from about 3.0 to between about 7.0 and 8.5 with the addition of about 0.1% to 1% of a 50% ammonium hydroxide ($NH_4OH$) solution. Table 1. shows a couple of illustrative examples.

TABLE 1

Example formulations for the conductive polymer composition and resulting conductive polymer film properties

|  | Example 1.1 | Example 1.2 | Example 1.3 | Example 1.4 | Example 1.5 |
| --- | --- | --- | --- | --- | --- |
| BAYTRON P-LS | 90 wt. % | 88.2 wt. % | 86.4 wt. % | 82.8 wt. % | 72 wt. % |
| RHOPLEX HA-16 | 10 wt. % | 9.8 wt. % | 9.6 wt. % | 9.2 wt. % | 8 wt. % |
| NMP | 0 | 2 wt. % | 4 wt. % | 8 wt. % | 20 wt. % |
| Tribo-charging | 10–50 V | 10–30 V | 5–15 V | <10 V | <10 V |

Note:
All conductive polymer compositions contained 0.1–0.3% Zonyl ® FSN

The conductive polymer composition is applied to the non-critical region of FOS circuits via a reel-to-reel pad printing system comprising an automatic web handling system capable of handling webs from about 70 mm to about 300 mm wide, preferably 70 mm wide, a printing station, and a drying station. The system configuration and set up shown in FIG. 2. This process may be integrated with FOS circuits manufacturing by removing the web handling equipment and inserting the printing station into the flexible circuit manufacturing line either before or after the application of the protective covercoat layer or used as a stand alone process on a finished web of flexible circuits having a protective covercoat layer.

Figure 3:
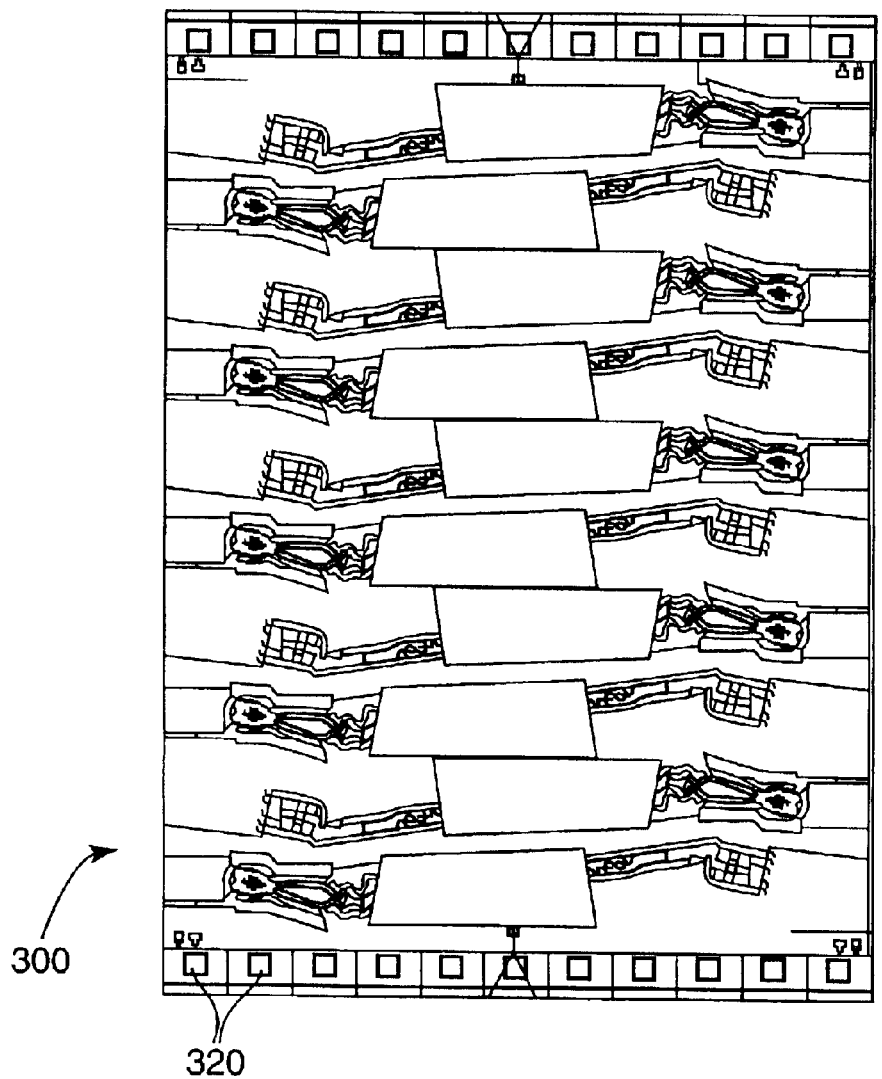
FIG. 3 shows an example of the printed pattern that has been applied across the width of a flexible circuit web.

The paper liner or polymer liner will be put in underneath of the microflex web during the pad printing process in which functioning to prevent ink flowing and spread from the unwanted regions. The downweb placement tolerance is controlled by the sprocket holes (320 in FIG. 3) on the sides of the flexible circuit web 300 and can be expressed as +/−0.254 mm in accumulated error over 32 pitches in down web. The cross web printing tolerance is somewhat dependent on the circuit design being coated, but is nominally about 40 mils.

The automatic web handling system capable of handling webs from about 70 mm to about 300 mm wide, preferably 70 mm wide, comprising a web unwind station 205 before the printing station 220 and a web wind up station 260 after the ovens 245. The unwind station can accommodate two rolls of material, the web of flexible circuits 215 and a roll of an interlever material 210. The purpose of the interlever material is help contain the conductive polymer composition prior to evaporation of the solvent. The interlever layer being substantially the same width as the flexible circuit web. By controlling the amount of the conductive polymer composition administered to the surface of the circuit and the area to which it is delivered, the interlever may serve an additional role by allowing the backside of the circuit to also be coated, which in turn will provide additional ESD protection to the circuit. Frequently, flexible circuits will have openings through the dielectric substrate to facilitate the separation of individual parts. By controlling the amount of the conductive polymer composition, the backside can be coated by material that passes through these openings and wicks between the flexible circuit dielectric substrate and the interlever material. The interlever material being selected from the group consisting of a bumped interlever, a release liner or a Teflon interlever. The interlever unwraps off of its roll 210. It then passes the roll of flexible circuits which are fed off of their roll at the same speed in the web direction v. Several idler rollers are used to maintain the appropriate web tension of the film. The flexible circuit web on the interlever then enters the printing station 220.

Figure 2:
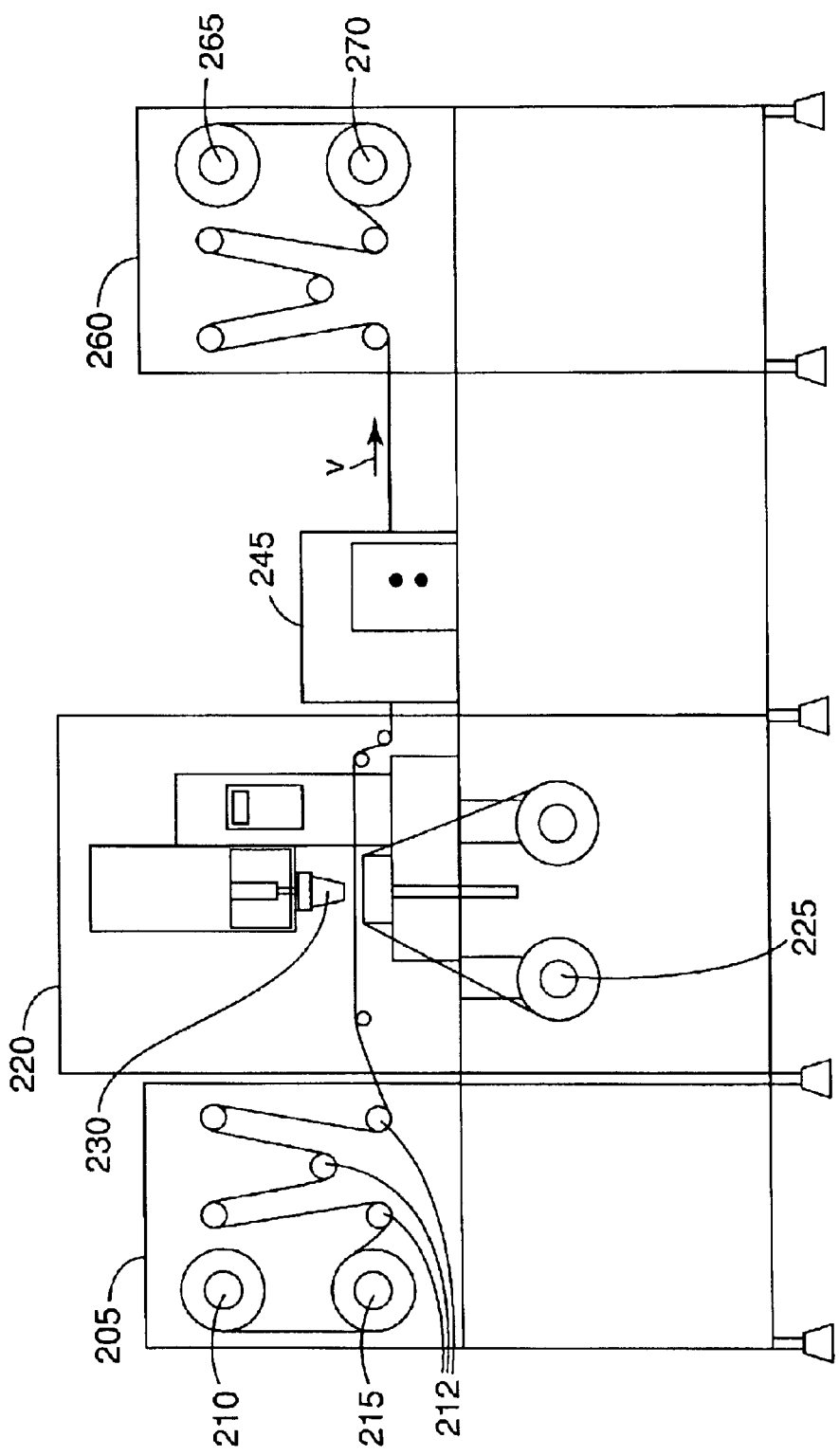
FIG. 2 is a schematic representation of the method of making the present invention.

The conductive polymer composition is applied to the non-critical area of the HDD circuits on the flexible circuit web. The application method may be a transfer printing technique such as screen printing or pad printing. The printing station shown in FIG. 2 is a pad printing station, by way of example. As the flexible circuit material 215 is advanced into the printing station, the print head 230 is loaded with the conductive polymer composition and subsequently stamped across the web. The print head 230 is designed in such a way as to deposit the conductive polymer composition in the non-critical region of the HDD circuits transversely across the entire width of the web (see FIG. 3). This step is repeated at prescribed intervals such that each row of HDD circuits located longitudinally located along the length of the web are stamped in a similar manner. A roll of absorbent paper may be used in conjunction with the printing station as shown in FIG. 2 in order to maintain the necessary level of cleanliness to contain the conductive polymer composition prior to evaporation of the solvent.

After printing, the flexible circuit material proceeds into at least one oven. The excess solvent is dried off and the binder resin is crosslinked in the ovens. The preferred oven arrangement allows for a pre-bake step to evaporate the solvent and a bake step to crosslink the resin and remove any residual solvent. The pre-bake zone of the oven is set at a temperature in the range of about 40° C. to about 90° C. The final bake step may be done either on-line or off-line in a second oven (not shown) after the pre-baked circuits have been wound up on the windup station. The final baking temperatures are in the range of about 120° C. to about 180° C. The ovens may be either infrared ovens or force air convection ovens.

For the pad printing process, it is important to have uniformity of the conductive polymer film either on the covercoat surface or on the bare polyimide substrate. These surfaces typically have low surface energies in the range of about 28 dyne/cm to about 39 dyne/cm. Surface energies were determined by using marking pens containing standard surface tension solutions available from Sherman Treaters, UK.

Using electron microscopy techniques, it was determined that the conductive polymer film thickness distribution range was about 0.2 microns to about 5 microns. Various conventional surface treatment steps were explored as a means of increasing the surface energy on the covercoat or polyimide, which in turn should improve the adhesion and film uniformity. Surprisingly, surface resistance measurements showed that plasma etching raises the conductivity of the film by at least a factor of ten when compared with a surface without plasma treatment. Corona treatment should yield similar or better results.

The plasma pretreatment is done just prior to coating the conductive polymer composition onto the circuits. A mixed gas plasma is used that contains argon, nitrogen, and oxygen. The web speed is set at about 3 mpm at a temperature of about 120° C.

Coating thickness can be varied by single, double, or even multiple printing to increase film thickness and, thus, its conductivity.

Surface resistance measurements were conducted on either single circuit surface or other film surface having a conductive polymer film on the surface. The measurements were made using a Hiresta UP MCP-HT260 Resistivity Meter (Mitsubishi Chemical, Tokyo, Japan) with an HRS ring probe.

ESD sensitivity of HGA's is related to the dischargeable energy on the part, which can be directed through the GMR element of the Read/Write head. If the flexible circuit's dielectric surface is contacted by another dielectric, or ungrounded conductive material, when the different materials are separated, an instantaneous voltage potential will be created due to the presence of either an excess of positive or negative charges forming on the surface. If the surface has high resistivity, the charge will remain, not being able to dissipate or bleed off. If the material is conductive, the charges will diffuse and find a neutralizing charge (decay). For electronic circuits, good dielectric materials are usually desired which makes tribocharging effects very common.

The voltage level is directly related to the number of charged sites/per area on the surface of the circuit. One method is directly measuring the surface voltage is by using a Isoprobe® Electrostatic Voltmeter-Model 244A (Monroe Electronics, Lyndonville, N.Y.). For high resistance surfaces, the peak voltage or voltage range across the parts can be measured to determine if surface treatments reduce the measured voltage levels.

Figure 4:
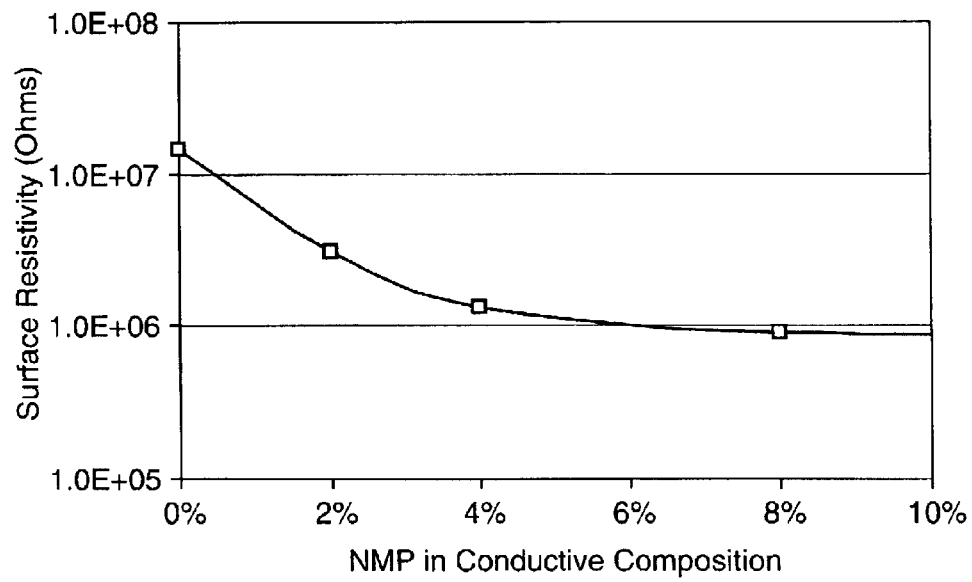
FIG. 4 shows the relationship between the surface resistivity of a circuit on the percentage of NMP in the conductive polymer composition.

FIG. 4 shows the relationship between the surface resistivity of a circuit on the percentage of NMP in the conductive polymer composition from the examples shown in Table 1 for a conductive polymer film of a given thickness. The conductivity can be further enhanced by applying a thicker film.

Figure 5:
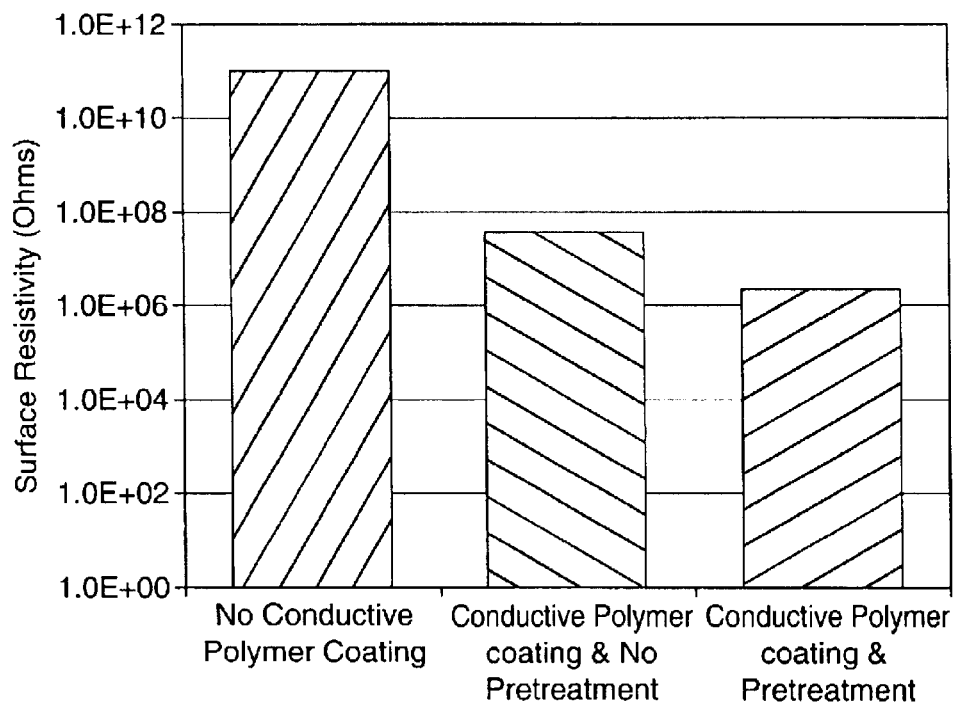
FIG. 5 shows the relationship between the surface resistivity of a circuit and the use of a plasma treatment step prior to coating the conductive polymer composition.

FIG. 5 shows the relationship between the surface resistivity of a circuit and the use of a plasma treatment step prior to coating the conductive polymer composition. The surface resistance of a pretreated circuit is compared to a non-pretreated circuit as well as a circuit that does not have a conductive film layer for ESD Protection.

What is claimed is:

1. A flexible circuit incorporating an electrostatic discharge limiting feature, said circuit comprising a dielectric substrate selected from the group consisting of polyimide or liquid crystal polymer film having at least one conductive trace coated on at least one surface thereof, said circuit further comprising a on one end an actuator flex region having bond pads and on the other end a gimbal region having bond pads, and an intermediate, non-critical region having no bond pads, said discharge limiting feature comprising a thin conductive polymer coating applied over at least a portion of only the non-critical region of the circuit, said discharge limiting feature reducing the surface resistivity of the circuit to about $10^4$ ohms to about $10^8$ ohms and having tribocharging of less than about 50V.

2. A flexible circuit according to claim 1 wherein said conductive polymer coating comprises from about 10 to about 90 weight percent of an aqueous dispersion of at least 1.3 weight percent conductive polymer, from about 10 to about 90 weight percent of an aqueous emulsion of about 45.5 weight percent nonionic self crosslinking acrylic binder resin, and 0.1 to 1 weight percent aqueous solution of about 50 weight percent ammonium hydroxide.

3. A flexible circuit according to claim 2 wherein said discharge limiting feature comprises a polymer coating comprising a blend of polyethylenedioxythiophene and polystyrenesulfonate, wherein the aqueous dispersion contains from about 2% to about 3% conductive polymer.

4. A flexible circuit according to claim 2 wherein said polymer coating further comprises from about 2% to about 8% of 1-methyl-2-pyrrolidone.

5. A flexible circuit according to claim 1 wherein the conductive polymer is substantially transparent to the visible light.

6. A flexible circuit according to claim 1 further comprising a selectively deposited protective covercoat layer over said trace, said conductive polymer coating being coated thereover.

7. A flexible circuit according to claim 1 wherein the conductive trace has been formed by applying a photoresist to at least one surface of the dielectric substrate, patterning the photoresist with a desired circuit pattern, and additively plating said circuit pattern with a conductive metal selected from the group consisting of copper, nickel, and gold.

8. A flexible circuit according to claim 1 wherein the tribocharging is less than 15 V.

9. A flexible circuit according to claim 1 wherein the tribocharging is less than 10 V.

10. A flexible circuit according to claim 1 wherein at least one surface is plasma treated.

* * * * *

UNITED STATES PATENT AND TRADEMARK OFFICE
CERTIFICATE OF CORRECTION

PATENT NO.     : 6,815,620 B2
DATED          : November 9, 2004
INVENTOR(S)    : Dodsworth, Robert S.

It is certified that error appears in the above-identified patent and that said Letters Patent is hereby corrected as shown below:

Column 6,
Line 66, after "comprising" delete "a".

Column 8,
Line 2, after "to" delete "the".

Signed and Sealed this

Twenty-fourth Day of May, 2005

JON W. DUDAS
*Director of the United States Patent and Trademark Office*